United States Patent
Kawai et al.

(10) Patent No.: US 9,941,284 B2
(45) Date of Patent: *Apr. 10, 2018

(54) SEMICONDUCTOR DEVICE

(71) Applicant: Renesas Electronics Corporation, Tokyo (JP)

(72) Inventors: Tohru Kawai, Tokyo (JP); Masahiro Shimizu, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/657,690

(22) Filed: Jul. 24, 2017

(65) Prior Publication Data

US 2017/0323890 A1 Nov. 9, 2017

Related U.S. Application Data

(63) Continuation of application No. 15/359,729, filed on Nov. 23, 2016, now Pat. No. 9,748,247.

(30) Foreign Application Priority Data

Dec. 11, 2015 (JP) .................................. 2015-241692

(51) Int. Cl.
*H01L 27/092* (2006.01)
*G11C 11/419* (2006.01)

(52) U.S. Cl.
CPC ........ *H01L 27/0928* (2013.01); *G11C 11/419* (2013.01)

(58) Field of Classification Search
None
See application file for complete search history.

(56) References Cited

U.S. PATENT DOCUMENTS

| | | | |
|---|---|---|---|
| 8,120,116 B2 | 2/2012 | Takeuchi | |
| 8,766,376 B2 | 7/2014 | Yang et al. | |
| 9,385,133 B2 | 7/2016 | Morimoto et al. | |
| 2005/0146961 A1 | 7/2005 | Osada et al. | |
| 2011/0235407 A1 | 9/2011 | Lim et al. | |
| 2013/0026580 A1 | 1/2013 | Morimoto et al. | |
| 2013/0141963 A1 | 6/2013 | Liaw | |
| 2015/0009750 A1 | 1/2015 | Schaefer et al. | |
| 2015/0243667 A1 | 8/2015 | Liaw | |
| 2016/0078922 A1 | 3/2016 | Liaw | |
| 2016/0118407 A1 | 4/2016 | Makiyama | |
| 2016/0133633 A1 | 5/2016 | Liaw | |

FOREIGN PATENT DOCUMENTS

JP 2010-87420 A 4/2010

*Primary Examiner* — Alexander Ghyka

(74) *Attorney, Agent, or Firm* — Sughrue Mion, PLLC

(57) ABSTRACT

A semiconductor device aims to prevent a leak current from flowing between a well and a corner of an active region formed on an upper surface of another well in an SRAM. In a memory cell of the SRAM, a load MOSFET is formed. An end of an active region extending in y-direction is arranged to gradually go away from a p-well as it goes from a gate electrode G2 side to a gate electrode G4 side in such a manner that a distance in x-direction between the end of the active region and the p-well is larger than a shortest distance in the x-direction between the p-well and the active region.

15 Claims, 7 Drawing Sheets

SEMICONDUCTOR DEVICE

CROSS-REFERENCE TO RELATED APPLICATIONS

This application is a Continuation of U.S. application Ser. No. 15/359,729, filed Nov. 23, 2016, which claims the benefit of priority of Japanese Patent Application No. 2015-241692, filed on Dec. 11, 2015 including the specification, drawings and abstract are incorporated herein by reference in their entirety.

BACKGROUND

The present invention relates to a semiconductor device and, in particular, relates to a technique that is effective when being applied to a semiconductor device including an SRAM (Static Random Access Memory).

An SRAM that is one of semiconductor memory devices includes a CMOS. A memory cell for one port of the SRAM is usually formed by six transistors.

Japanese Unexamined Patent Application Publication No. 2010-87420 describes a shared contact hole of the SRAM opened at a position displaced from a center line of a channel forming region that extends along an extending direction of the channel forming region, in order to reduce an opening failure of the shared contact hole.

SUMMARY

In miniaturization of an SRAM, when an impurity concentration in each well is increased in order to maintain an isolation breakdown voltage between a p-type well and an n-type well, an electric field at a PN junction between the p-type well and the n-type well becomes larger. This causes generation of impact ions between one of the wells and an active region in an upper surface of the other well, resulting in reduction of the breakdown voltage.

Other problems and novel features will be apparent from the description of this specification and the accompanying drawings.

The summary of a typical one of embodiments disclosed in the present application is briefly described below.

A semiconductor device according to an embodiment includes a first well and a second well arranged in a first direction side by side in an upper surface of a substrate, and an active region formed in an upper surface of the second well to extend in a second direction perpendicular to the first direction. A distance in the first direction between an end of the active region and the first well is larger than a distance in the first direction between an extending portion of the active region and the first well.

According to an embodiment disclosed in the present application, reliability of a semiconductor device can be improved.

DETAILED DESCRIPTION

Figure 1:
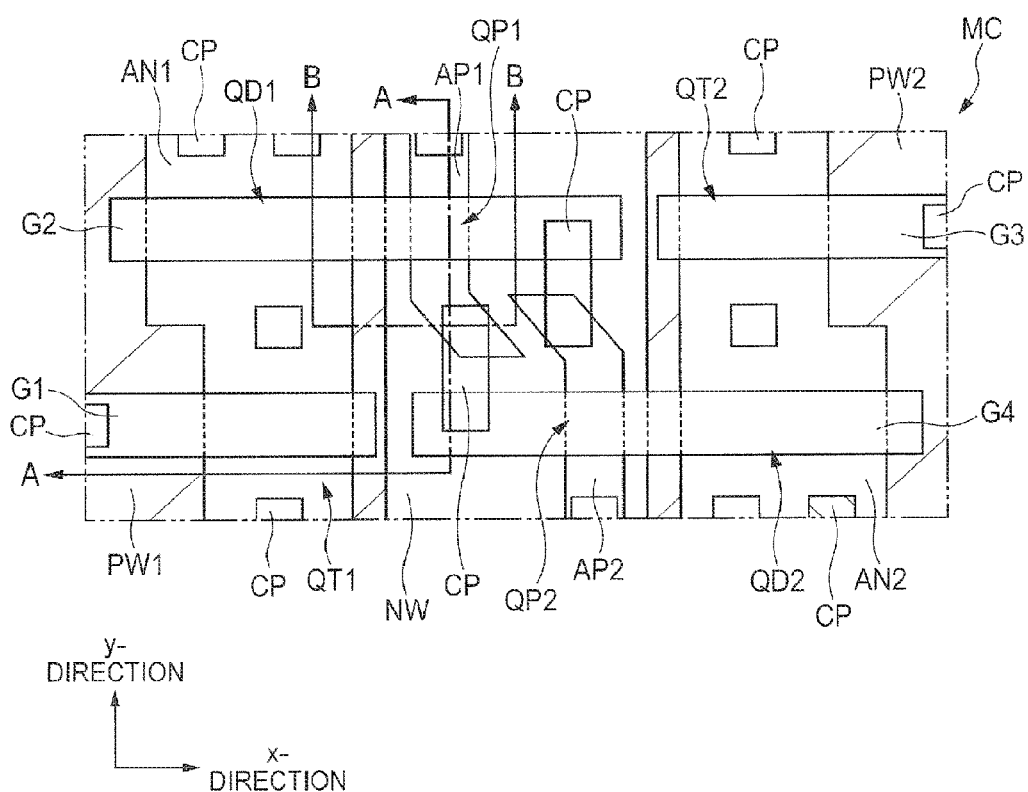
FIG. 1 is a plan view of a semiconductor device according to a first embodiment of the present invention.

Embodiments will be described in detail below, referring to the drawings. Throughout the drawings for explaining the embodiments, members having the same function are labelled with the same reference signs, and the redundant description thereof is omitted. In the following embodiments, the description of the same or similar portion is not repeated in principle, except when necessary.

First Embodiment

A semiconductor device according to a present embodiment relates to a layout of a semiconductor region forming a MOSFET (Metal Oxide Semiconductor Field Effect Transistor) constituting an SRAM.

Figure 2:
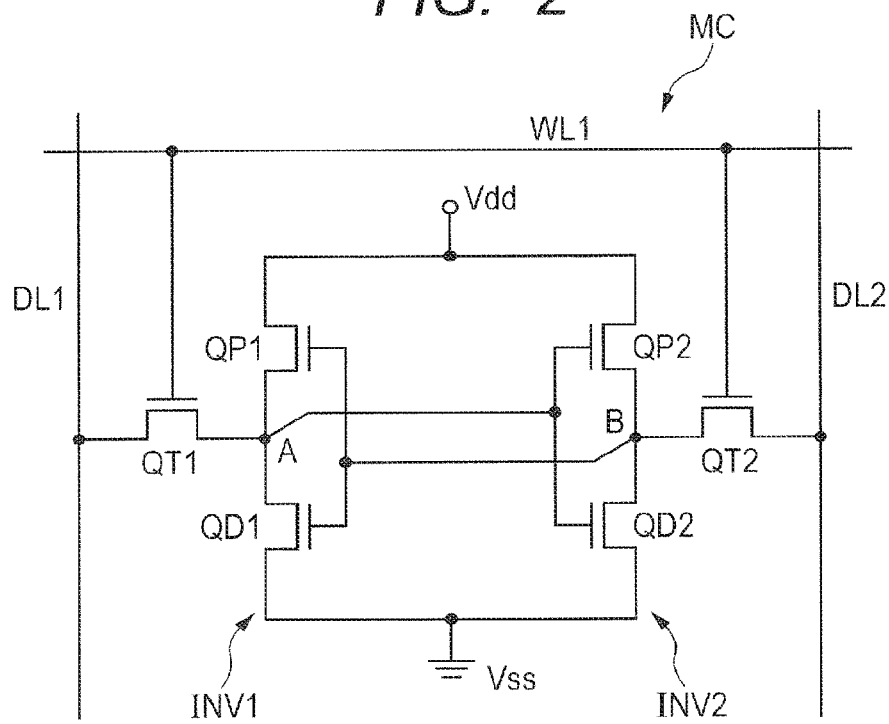
FIG. 2 is an equivalent circuit diagram of an SRAM according to the first embodiment of the present invention.
Figure 3:
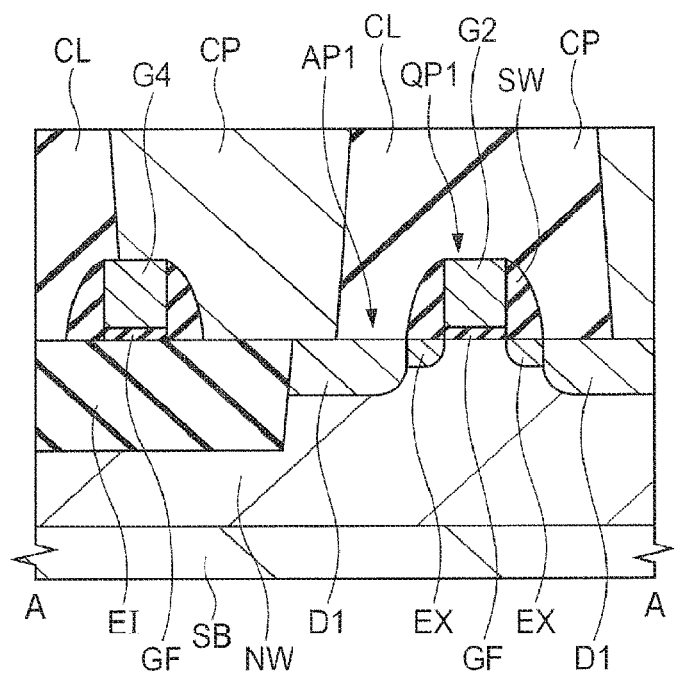
FIG. 3 is a cross-sectional view, taken along line A-A in FIG. 1.
Figure 4:
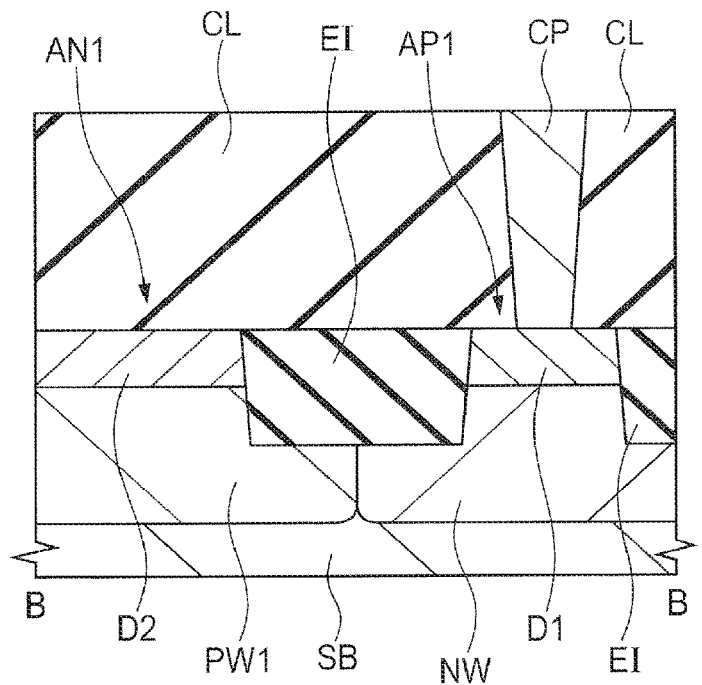
FIG. 4 is a cross-sectional view, taken along line B-B in FIG. 1.

Referring to FIGS. 1 to 4, the structure of the semiconductor device of the present embodiment is described below. FIG. 1 is a plan view of the semiconductor device of the present embodiment. FIG. 2 is an equivalent circuit diagram of the SRAM of the present embodiment. FIG. 3 is a cross-sectional view, taken along line A-A in FIG. 1. FIG. 4 is a cross-sectional view, taken along line B-B in FIG. 1.

First, a layout configuration of the SRAM in the present embodiment is described, referring to FIG. 1. FIG. 1 is a plan view of one memory cell MC constituting the SRAM formed in an element region of a semiconductor chip, that is, a single port memory cell. The memory cell MC of the SRAM is formed by six field effect transistors on a semiconductor substrate including a pair of driving MOSFETs QD1 and QD2, a pair of load MOSFETs QP1 and QP2, and a pair of transfer MOSFETs QT1 and QT2.

In FIG. 1, a boundary between one memory cell MC and its adjacent memory cell MC (not illustrated) is sectioned and illustrated with long dashed double-short dashed line. Although the memory cell MC adjacent to the memory cell MC illustrated in FIG. 1 is not illustrated, memory cells MC adjacent in y-direction or x-direction have symmetrical layouts with respect to this long dashed double-short dashed line as an axis. For example, although one end of an active region AP1 extending in the y-direction is illustrated in FIG. 1, the other end is not illustrated. The other end is arranged on an upper side of FIG. 1 at a position symmetrical to the one end with respect to the long dashed double-short dashed line as the axis. Note that the x-direction and the y-direction are directions along an upper surface of the semiconductor substrate and are perpendicular to each other. In addition, FIG. 1 illustrates a contour of a region of each active region, covered by each gate electrode, with dashed line.

In a region where one memory cell MC having an SRAM structure is formed, that is, a region surrounded by the long dashed double-short dashed line in FIG. 1 (hereinafter, simply referred to a memory cell region), a p-well (a p-type well) PW1, an n-well (an n-type well) NW, and a p-well (a p-type well) PW2 are formed in the upper surface of the semiconductor substrate to be arranged in the x-direction in that order. The p-wells PW1 and PW2 arranged to sandwich the n-well NW therebetween are p-type semiconductor regions formed in the upper surface of the semiconductor substrate. The n-well is an n-type semiconductor region formed in the upper surface of the semiconductor substrate. Active regions AN1, AP1, AP2, and AN2 are separated from each other. The p-wells PW1 and PW2 are hatched for ease of understanding of the drawing.

Each of the driving MOSFET QD1 and the transfer MOSFET QT1 is an n-channel MOSFET formed on the p-well PW1. Each of the driving MOSFET QD2 and the transfer MOSFET QT2 is an n-channel MOSFET formed on the p-well PW2. Further, the load MOSFETs QP1 and QP2 are p-channel MOSFETs formed on the n-well NW.

The upper surface of the semiconductor substrate is sectioned into a plurality of active regions AN1, AN2, AP1, and AP2 by element-isolation regions (not illustrated). That is, each of the active regions AN1, AN2, AP1, and AP2 is surrounded by the element-isolation region, so that layouts of these active regions are each defined by the element-isolation region. In other words, the upper surface of the semiconductor substrate, exposed from the element-isolation region, is referred to as the active region AN1, AN2, AP1, or AP2 here. That is, in FIG. 1, the n-well NW and the p-wells PW1 and PW1 are illustrated under the element-isolation regions that are formed on the semiconductor substrate and are transparently illustrated. In the present application, the active region refers to the upper surface of the semiconductor substrate exposed from the element-isolation region.

Each of the active regions AN1, AN2, AP1, and AP2 extends in the y-direction. In the x-direction, the active regions AN1, AP1, AP2, and AN2 are arranged in that order. The active region AN1 is formed in the upper surface of the p-well PW1, the active regions AP1 and AP2 are formed in the upper surface of the n-well NW, and the active region AN2 is formed in the upper surface of the p-well PW2.

Each of the active regions AN1 and AN2 extends in the y-direction from one end of the memory cell region to the other end. The active region AP1 extends in the y-direction from one of ends of the memory cell region, i.e., a first end, to a center portion of the memory cell region, but does not reach the other end, that is, a second end. Also, the active region AP2 extends in the y-direction from one of ends of the memory cell region, i.e., the second end, to the center portion of the memory cell, but does not reach the other end, that is, the first end.

Inside each of the active regions AN1 and AN2 where the driving MOSFETs QD1 and QD2 and the transfer MOSFETs QT1 and QT2 are formed, an n-type diffusion region is formed by introducing an n-type impurity, such as P (phosphorus) or As (arsenic). This diffusion region forms a source region and a drain region. On the active regions AN1 and AN2 between the source region and the drain region, a gate electrode G1, G2, G3, or G4 is formed via a gate insulation film (not illustrated). Each of the gate electrodes G1 to G4 extends in the x-direction that crosses perpendicularly to the y-direction in which each of the active regions AN1, AN2, AP1, and AP2 extends.

Inside each of the active regions AP1 and AP2 where the load MOSFETs QP1 and QP2 are formed, a p-type diffusion region is formed by introducing a p-type impurity, such as B (boron). This diffusion region forms a source region and a drain region. Directly above a region of the active region AP1 between the source region and the drain region, the gate electrode G2 is formed via the gate insulation film (not illustrated). Directly above a region of the active region AP2 between the source region and the drain region, the gate electrode G4 is formed via the gate insulation film (not illustrated).

That is, in a plan view, the gate electrode G1 overlaps the active region AN1 only, the gate electrode G2 overlaps the active regions AN1 and AP1 only, the gate electrode G3 overlaps the active region AN2 only, and the gate electrode G4 overlaps the active regions AN2 and AP2 only. In the x-direction, one end of the gate electrode G2 is terminated directly above the p-well PW1, and the other end is terminated directly above the n-well NW. One end of the gate electrode G4 is terminated directly above the p-well PW2, and the other end is terminated directly above the n-well NW. Within the memory cell region, the gate electrode G1 is formed directly above the p-well PW1 only, and the gate electrode G3 is formed directly above the p-well PW2 only.

The transfer MOSFET QT1 is formed by the gate electrode G1 formed on the active region AN1 and the source and drain regions formed in the active region AN1 to sandwich the gate electrode G1 therebetween in a plan view. The driving MOSFET QD1 is formed by the gate electrode G2 formed on the active region AN1 and the source and drain regions formed in the active region AN1 to sandwich the gate electrode G2 therebetween in a plan view. The drain region of the driving MOSFET QD1 and the source and drain regions of the transfer MOSFET QT1 are formed by the same diffusion region. Note that the source region and the drain region of the transfer MOSFET QT1 may be switched in accordance with an operation of the transfer MOSFET QT1.

The transfer MOSFET QT2 is formed by the gate electrode G3 formed on the active region AN2 and the source and drain regions formed in the active region AN2 to sandwich the gate electrode G3 therebetween in a plan view. The driving MOSFET QD2 is formed by the gate electrode G4 formed on the active region AN2 and the source and drain regions formed in the active region AN2 to sandwich the gate electrode G4 therebetween in a plan view. The drain region of the driving MOSFET QD2 and the source and drain regions of the transfer MOSFET QT2 are formed by the same diffusion region. Note that the source region and the drain region of the transfer MOSFET QT2 may be switched in accordance with an operation of the transfer MOSFET QT2.

The load MOSFET QP1 is formed by the gate electrode G2 formed on the active region AP1 and the source and drain regions formed in the active region AP1 to sandwich the gate electrode G2 therebetween in a plan view. The load MOSFET QP2 is formed by the gate electrode G4 formed on the active region AP2 and the source and drain regions formed in the active region AP2 to sandwich the gate electrode G4 therebetween in a plan view.

Although memory cells MC adjacent to the memory cell MC illustrated in FIG. 1 are not illustrated, memory cells MC adjacent to each other in the x-direction share the gate electrode G1 forming the transfer MOSFET QT1 or the gate electrode G3 forming the transfer MOSFET QT2. Further, memory cells MC adjacent to each other in the y-direction share the active region AN1 or AN2 and further share the active region AP1 or AP2. The active regions AN1 and AN2 each have a wider width than the active regions AP1 and AP2 in the x-direction, that is, a gate-width direction. Further, each of the driving MOSFETs QD1 and QD2 has a larger gate width than each of the transfer MOSFETs QT1 and QT2.

In the present embodiment, both the boundary between the p-well PW1 and the n-well NW and the boundary between the n-well NW and the p-well PW2 extend straight in the y-direction. That is, these boundaries extend straight between both ends of the memory cell region in the y-direction. The active regions AP1 and AP2 are respectively away from the boundary between the p-well PW1 and the n-well NW and the boundary between the n-well NW and the p-well PW2 in a plan view. Also, each of the active regions AP1 and AP2 does not have a shape extending straight in the y-direction only, but has a special shape that is a feature of the present embodiment at an end in the y-direction.

More specifically, the active region AP1 has an extending portion extending straight in the y-direction and the end coupled to the extending portion within the memory cell region. In a plan view, the extending portion is overlapped by the gate electrode G2, and the gate electrode G4 is arranged above an extension of the extending portion in its extending direction. That is, the end of the active region AP1 is located between the gate electrode G4 and the gate electrode G2 in a plan view. Also, this end has a terminated portion of the active region AP1 in its closest region to the gate electrode G2.

A distance in the x-direction between this extending portion of the active region AP1 and the boundary between the p-well PW1 and the n-well NW is constant at any portion. On the other hand, a distance in the x-direction between the end of the active region AP1 and the above-described boundary gradually increases from the extending portion side to the gate electrode G4 side. In other words, a distance in the x-direction between the active region AP1 and the above-described boundary gradually increases as it goes from the extending portion side towards the terminated portion of the active region AP1 in the y-direction. Therefore, a distance in the x-direction between the terminated portion and the p-well PW1 is the largest in the distance in the x-direction between the active region AP1 and the above-described boundary.

In other words, the active region AP1 has a shape in which the active region AP1 gradually goes away from the above-described boundary as it goes from the gate electrode G2 side to the gate electrode G4 side in a plan view. Therefore, the distance in the x-direction between the p-well PW1 and the end of the active region AP1 is larger than the shortest distance in the x-direction between the p-well PW1 and the active region AP1.

In a plan view, among sides forming the active region AP1, a first side on the above-described boundary side has a second side that is one side of the extending portion and a third side that is one side of the end. The second side extends in parallel to the above-described boundary, and the third side extends obliquely with respect to the above-described boundary. An angle formed by the second side and the third side is larger than 90 degrees and is smaller than 180 degrees. Therefore, the distance in the x-direction between the active region AP1 and the above-described boundary is larger on the gate electrode G4 side than on the gate electrode G2 side. Further, an angle formed by one of the sides forming the active region AP1, that is opposed to the gate electrode G4, and the third side is larger than 90 degrees and is smaller than 180 degrees.

That is, among a plurality of corners of the active region AP1, all of angles of corners that are in contact with the sides of the active region AP1 on the p-well PW1 side are larger than 90 degrees and are smaller than 180 degrees. The reason why such a shape is applied to the active region AP1 is to prevent a large current from being caused to flow between the p-well PW1 and the active region AP1 by concentration of a current flowing between the p-well PW1 and the active region AP1 to a corner of the active region AP1, as will be described later.

In addition, a distance in the x-direction between the extending portion of the active region AP1 and the boundary between the n-well NW and the p-well PW2 is constant in any portion. On the other hand, a distance in the x-direction between the end of the active region AP1 and this boundary decreases from the extending portion side to the gate electrode G4 side. In other words, the active region AP1 has a shape in which the active region AP1 gradually goes closer to this boundary as it goes from the gate electrode G2 side to the gate electrode G4 side in a plan view.

In a plan view, among the sides forming the active region AP1, a fourth side on this boundary side has a fifth side that is one side of the extending portion and a sixth side that is one side of the end. The fifth side extends in parallel to this boundary, and the sixth side extends obliquely with respect to this boundary. That is, a distance in the x-direction between the active region AP1 and this boundary is smaller on the gate electrode G4 side than on the gate electrode G2 side. The reason why such a shape is applied to the active region AP1 is to ensure a large contact area between a contact plug (a coupling portion) and the active region AP1, thus preventing occurrence of a coupling failure between the contact plug and the active region AP1, as will be described later.

The layout of the active region AP1 has been described in the above description. The active region AP2 also has a point-symmetric layout with respect to the active region AP1 within the memory cell region. That is, an end of the active region AP2 between the gate electrode G4 and the gate electrode G2 has a shape in which the active region AP2 goes away from the boundary between the n-well NW and the p-well PW2 as it goes from the gate electrode G4 side to the gate electrode G2 side. In other words, a distance in the x-direction between the active region AP2 and this boundary is larger on the gate electrode G2 side than on the gate electrode G4 side.

Further, in FIG. 1, the active region AP1 and the gate electrode G4 are away from each other, and the active region AP2 and the gate electrode G2 are away from each other. However, in a plan view, the active region AP1 and the gate electrode G4 may be in contact with each other, and the active region AP2 and the gate electrode G2 may be in contact with each other.

To an upper surface of each of the active regions AN1, AN2, AP1, and AP2 and the gate electrodes G1 to G4, a contact plug (a coupling portion) CP is coupled. The end in the y-direction of the active region AP1 and the gate electrode G4 are electrically coupled to one contact plug CP. That is, the contact plug CP coupling the gate electrode G4 and the active region AP1 is a shared contact plug. This shared contact plug is arranged to extend over the gate electrode G4 and the active region AP1. Similarly, the end in the y-direction of the active region AP2 and the gate electrode G2 are electrically coupled to another one of the contact plugs CP. That is, the contact plug CP coupling the gate electrode G2 and the active region AP2 is a shared contact plug. This shared contact plug is arranged to extend over the gate electrode G2 and the active region AP2.

The contact plug CP coupled to the active region AP1 extends in the y-direction. A center line along the y-direction that passes through a center in the x-direction of the extending portion of the active region AP1 does not overlap a center line along the y-direction that passes through a center in the x-direction of this contact plug CP in a plan view. The center line of the contact plug CP is located on the p-well PW2 side of the center line of the extending portion of the active region AP1. The center line herein is a line passing through a center of a pattern extending in a certain direction, which is a center in a direction perpendicular to the extending direction of this pattern, in such a manner that the line extends in the extending direction.

Similarly, the contact plug CP coupled to the active region AP2 extends in the y-direction. A center line along the y-direction that passes through a center in the x-direction of the extending portion of the active region AP2 does not overlap a center line along the y-direction that passes through a center in the x-direction of this contact plug CP in a plan view. The center line of the contact plug CP is located on the p-well PW1 side of the center line of the extending portion of the active region AP2.

Next, a circuit configuration and an operation of the SRAM are described, referring to FIG. 2. First, an equivalent circuit of one memory cell MC forming the SRAM is illustrated in FIG. 2. As illustrated in FIG. 2, this memory cell MC includes driving transistors, load transistors, and transfer transistors arranged at intersections of data lines DL1 and DL2 that are a pair of complementary data lines, i.e., a pair of bit lines and a word line WL1. That is, the memory cell MC of the SRAM is formed by a pair of driving MOSFETs QD1 and QD2, a pair of load MOSFETs QP1 and QP2, and a pair of transfer MOSFETs QT1 and QT2. The driving MOSFETs QD1 and QD2 and the transfer MOSFETs QT1 and QT2 are formed by n-channel MOSFETs, respectively, and the load MOSFETs QP1 and QP2 are formed by p-channel MOSFETs, respectively.

Among the above-described six MOSFETs forming the memory cell MC, the driving MOSFET QD1 and the load MOSFET QP1 form a CMOS (Complementary Metal Oxide Semiconductor) inverter INV1, and the driving MOSFET QD2 and the load MOSFET QP2 form a CMOS inverter INV2. Storage nodes A and B that are input and output terminals of the pair of CMOS inverters INV1 and INV2 are cross-coupled and form a flip-flop circuit as an information storage unit that stores therein 1-bit information. The storage node A that is one of the input and output terminals of that flip-flop circuit is coupled to one of the source and drain regions of the transfer MOSFET QT1. The storage node B that is the other input and output terminal is coupled to one of the source and drain regions of the transfer MOSFET QT2.

Further, the other of the source and drain regions of the transfer MOSFET QT1 is coupled to the data line DL1, and the other of the source and drain regions of the transfer MOSFET QT2 is coupled to the data line DL2. Furthermore, one end of the flip-flop circuit, that is, the respective source regions of the load MOSFETs QP1 and QP2 are coupled to a power-source voltage Vdd, and the other end, that is, the respective source regions of the driving MOSFETs QD1 and QD2 are coupled to a reference voltage Vss.

The operation of the above-described circuit is described. When the storage node A of one CMOS inverter INV1 is at a high potential (H), the driving MOSFET QD2 is an ON state and therefore the storage node B of the other CMOS inverter INV2 is at a low potential (L). Therefore, the driving MOSFET QD1 is turned off, and the high potential (H) of the storage node A is maintained. That is, states of the storage nodes A and B are retained by a latch circuit in which the pair of CMOS inverters INV1 and INV2 are cross-coupled, and information is stored during a period in which the power-source voltage is applied.

To the respective gate electrodes of the transfer MOSFETs QT1 and QT2, the word line WL1 is coupled. By this word line WL1, conduction and non-conduction of the transfer MOSFETs QT1 and QT2 are controlled. When the word line WL1 is at a high potential (H), the transfer MOSFETs QT1 and QT2 are placed in ON-states and the latch circuit and the complementary data lines (the data lines DL1 and DL2) are electrically coupled. Therefore, the potential states of the storage nodes A and B (H or L) appear on the data lines DL1 and DL2, and can be read as information of the memory cell MC.

In a reading operation, a current flows from the data line DL1 to the storage node A in the transfer MOSFET QT1, and flows from the data line DL2 to the storage node B in the transfer MOSFET QT2. That is, in reading, in the active region of each of the transfer MOSFETs QT1 and QT2, the storage node A or B side serves as the source region and the data line DL1 or DL2 side serves as the drain region.

In a case of writing information into the memory cell MC, information of the data lines DL1 and DL2 is transferred to the storage nodes A and B, while the word line WL1 is placed at an H potential level and the transfer MOSFETs QT1 and QT2 are placed in ON states. In this writing operation, a current flows from the storage node A to the data line DL1 in the transfer MOSFET QT1, and flows from the storage node B to the data line DL2 in the transfer MOSFET QT2. That is, in writing, in the active region of each of the transfer MOSFETs QT1 and QT2, the data line DL1 or DL2 side serves as the source region and the storage node A or B side serves as the drain region. In this manner, the SRAM can be operated.

FIG. 3 illustrates a cross-section including the load MOSFET QP1 including the gate electrode G2, and the gate electrode G4. In other words, the cross-section along the y-direction is illustrated in FIG. 3. FIG. 3 is a cross-sectional view taken along a center line of the load MOSFET QP1. Also, in FIG. 3, the contact plug GP is illustrated, which electrically couples the drain region of the load MOSFET QP1 and the gate electrode G4 to each other. However, the cross-section of FIG. 3 does not include the terminated portion in the y-direction of the active region AP1, although it includes the end in the y-direction of the active region AP1.

The structure of a field effect transistor is described by referring to the load MOSFET QP1 as an example. The load MOSFET QP2 also has the same structure. Further, the transfer MOSFETs QT1 and QT2 and the driving MOSFETs QD1 and QD2 also have a structure including source and drain regions and a gate electrode, as with the load MOSFET QP1, except that a conductive type is different.

As illustrated in FIG. 3, the semiconductor device of the present embodiment has a semiconductor substrate SB. The semiconductor substrate SB is a single-crystal silicon substrate having a thickness of about 500 μm to 700 μm, for example, and a high resistance of 750 Ωcm or more, for example. In an upper surface of the semiconductor substrate SB, the n-well NW is formed, which is an n-type semiconductor region into which an n-type impurity (e.g., P (phosphorus) or As (arsenic)) is introduced.

A groove is formed in a portion of the upper surface of the semiconductor substrate SB, and an element-isolation region EI is formed by an insulation film (e.g., a silicon oxide film) with which the groove is embedded. The active region AP1 is the semiconductor substrate SB in a region that is exposed from the element-isolation region EI. That is, the element-isolation region EI isolates a plurality of active regions in the upper surface of the semiconductor substrate SB. The element-isolation region EI has an STI (Shallow Trench Isolation) structure or a LOCOS (Local Oxidation of Silicon) structure. The n-well NW is formed at a deeper level than the element-isolation region EI. That is, the bottom face of the element-isolation region EI reaches a halfway depth of the n-well NW.

The upper surface of the semiconductor substrate SB, directly below the gate electrode G2 of the load MOSFET QP1, is a channel region through which a current flows when the MOSFET is driven. A pair of source and drain regions is formed in the upper surface of the semiconductor substrate SB on both sides of the gate electrode G2 to sandwich the channel region therebetween. Each of the source and drain regions has an extension region EX that is a p-type semiconductor region and has a relatively low impurity concentration, and a diffusion layer D1 that is a p-type semiconductor region and has an impurity concentration higher than that of the extension region EX. That is, the extension region EX and the diffusion layer D1 are p-type semiconductor regions in which a p-type impurity (e.g., B (boron)) is introduced into the upper surface of the semiconductor substrate SB.

The extension region EX is formed closer to the channel region than the diffusion layer D1. The diffusion layer D1 forming the drain region of the load MOSFET QP1 is in contact with the element-isolation region EI. The extension region EX and the diffusion layer D1 are formed to be shallower than the element-isolation region EI.

The gate electrode G2 is formed directly above the semiconductor substrate SB between the source and drain regions of the load MOSFET QP1 via the gate insulation film GF. The gate electrode G4 is formed directly above the element-isolation region EI that is adjacent to the drain region of the load MOSFET QP1 via the gate insulation film GF. In a case where the gate insulation film GF is formed by thermal oxidation, for example, the gate insulation film GF may not be formed directly above the element-isolation region EI. However, a case is described here, in which the gate insulation film GF is formed between the element-isolation region EI and the gate electrode G4. The gate insulation film GF is not necessarily formed between the element-isolation region EI and the gate electrode G4.

On sidewalls of both sides of each of a multilayer film of the gate insulation film GF and the gate electrode G4 and a multilayer film of the gate insulation film GF and the gate electrode G2, sidewalls SW are formed in a self-alignment manner. The sidewall SW is formed by a silicon oxide film, a silicon nitride film, or a multilayer film thereof, for example. An upper surface of the diffusion layer D1 is exposed from the sidewalls SW. On an upper surface of each of the diffusion layer D1 and the gate electrodes G2 and G4, a silicide layer is formed, although not illustrated. The silicide layer is formed of NiSi (nickel silicide) or CoSi (cobalt silicide), for example.

On the semiconductor substrate SB, an interlayer insulation film CL is formed to cover the load MOSFET QP1 and the gate electrode G4. The interlayer insulation film CL includes a thin insulation film formed by a silicon nitride film and a thick insulation firm formed by a silicon oxide film that are stacked on the semiconductor substrate SB in that order. In this example, the thin insulation film and the thick insulation film that form the interlayer insulation film CL are illustrated as one layer in FIG. 3, but are not illustrated as separate layers. Further, a plurality of contact holes are formed through the interlayer insulation film CL.

Inside each of the contact holes, the contact plug CP is formed. An upper surface of each of the interlayer insulation film CL and the contact plug CP is flattened at the same height.

The contact plug CP is a columnar conductor, and is formed by a barrier conductor film covering a sidewall and a bottom of the contact hole and a main conductor film that is formed in the contact hole via the barrier conductor film in such a manner that the contact hole is completely embedded, for example. The barrier conductor film contains Ti (titanium) or TiN (titanium nitride), for example, and the main conductor film is formed of W (tungsten), for example. A part of the contact plugs CP is electrically coupled to the source region of the load MOSFET QP1 via the silicide layer. Another part of the contact plugs CP is electrically coupled to the drain region of the load MOSFET QP1 and the gate electrode G4 via the silicide layer.

Because the boundary between the element-isolation region EI and this drain region, and the sidewall SW at the sidewall of the gate electrode G4 are spaced away from each other, an upper surface of the element-isolation region EI is exposed from the gate electrode G4 and the sidewall SW between the sidewall SW and the drain region. Therefore, a portion of the bottom of the contact plug CP electrically coupled to the drain region and the gate electrode G4 is in contact with the upper surface of the element-isolation region EI.

A region on the interlayer insulation film CL and the contact plugs CP is a region where an interlayer insulation film and a wiring in a wiring groove extending through that interlayer insulation film are to be formed, although not illustrated. Each contact plug CP is coupled to that wiring.

FIG. 4 illustrates a cross-section along the x-direction including the boundary between the p-well PW1 and the n-well NW. FIG. 4 illustrates a diffusion layer D2 forming the drain region of the driving MOSFET QD1 illustrated in FIG. 1 and the source and drain regions of the transfer MOSFET QT1, and the diffusion layer D1 formed in the upper surface of the semiconductor substrate SB at the end of the active region AP1. Note that the extending portion and the terminated portion of the active region AP1 are not illustrated in FIG. 4. In other words, the active region AP1 illustrated in FIG. 4 is a portion thereof located between the extending portion and the terminated portion, that is, the end of the active region AP1.

As illustrated in FIG. 4, the element-isolation region EI is formed in the upper surface of the semiconductor substrate SB. In the upper surface of the semiconductor substrate SB and within the semiconductor substrate SB, the p-well PW1 and the n-well NW are formed at a deeper depth than the element-isolation region EI. The p-well PW1 and the n-well NW are in contact with each other directly below the element-isolation region EI. In the upper surface of the p-well PW1, the diffusion layer D2 of the active region AN1 is formed. In the upper surface of the n-well NW, the diffusion layer D1 of the active region AP1 is formed.

The semiconductor device of the present embodiment can be formed by the same manufacturing method as that described in Japanese Unexamined Patent Application Publication No. 2010-87420 described above.

Figure 5:
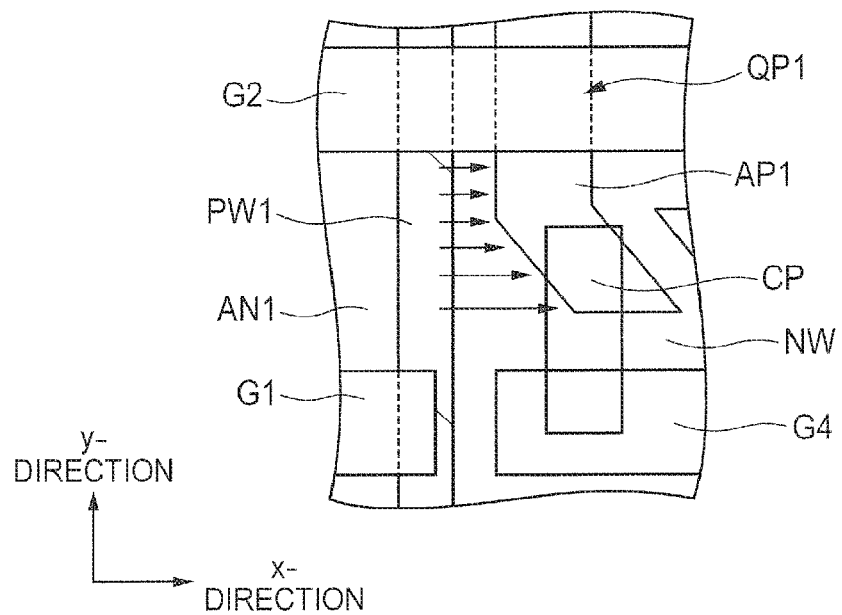
FIG. 5 is an enlarged plan view of a portion in FIG. 1.
Figure 8:
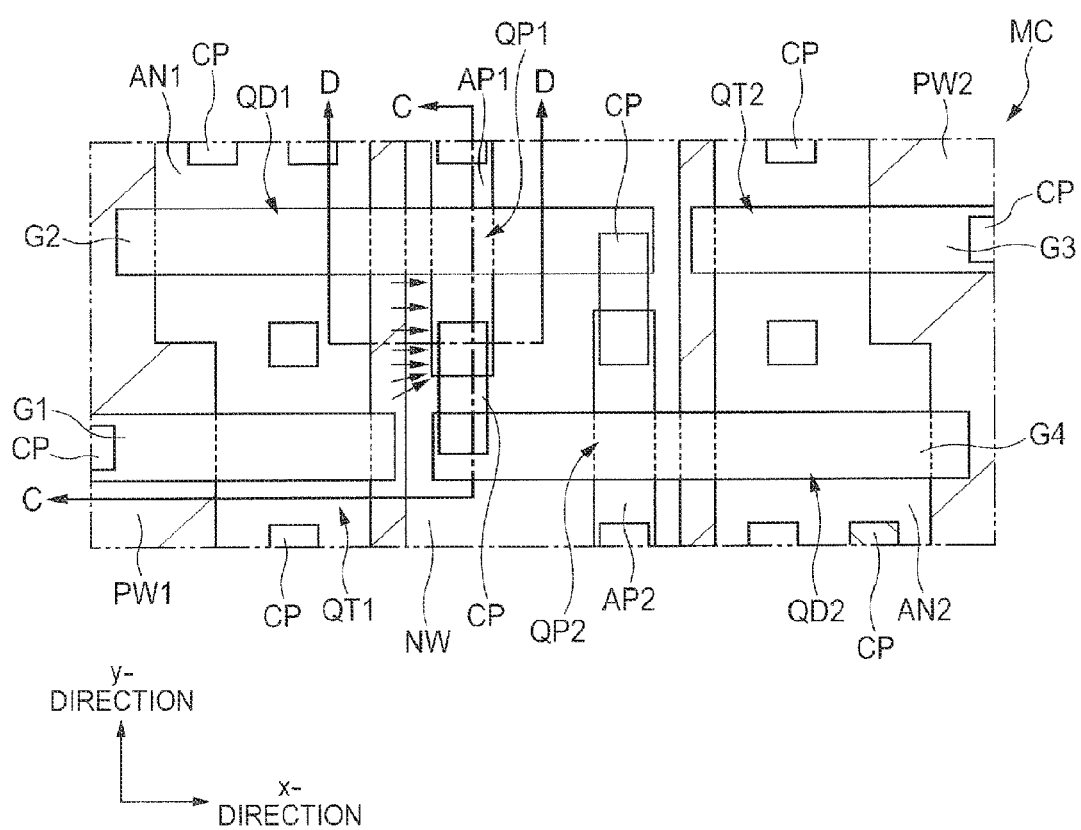
FIG. 8 is a plan view of a semiconductor device according to a comparative example.
Figure 9:
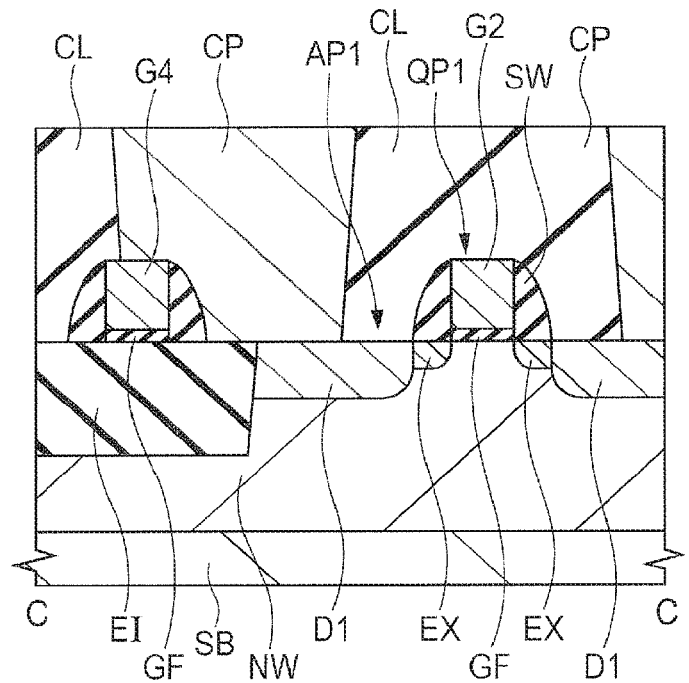
FIG. 9 is a cross-sectional view, taken along line C-C in FIG. 8.
Figure 10:
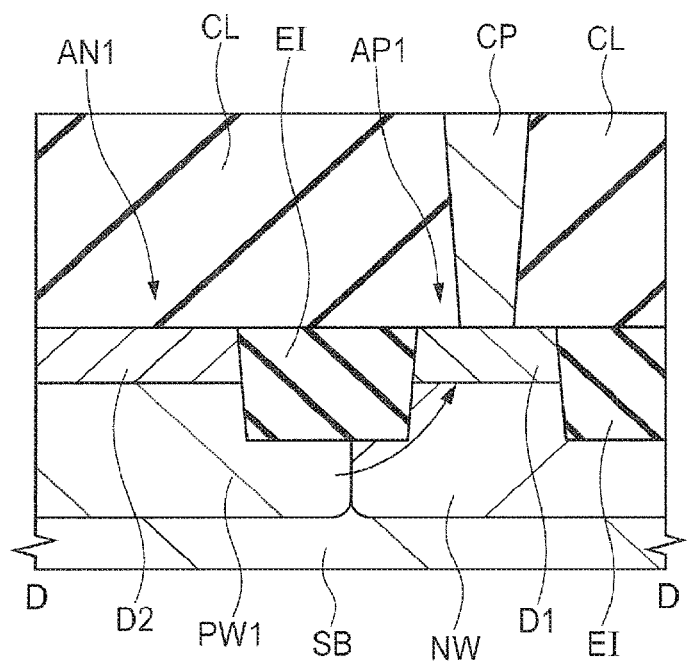
FIG. 10 is a cross-sectional view, taken along line D-D in FIG. 8.
Figure 11:
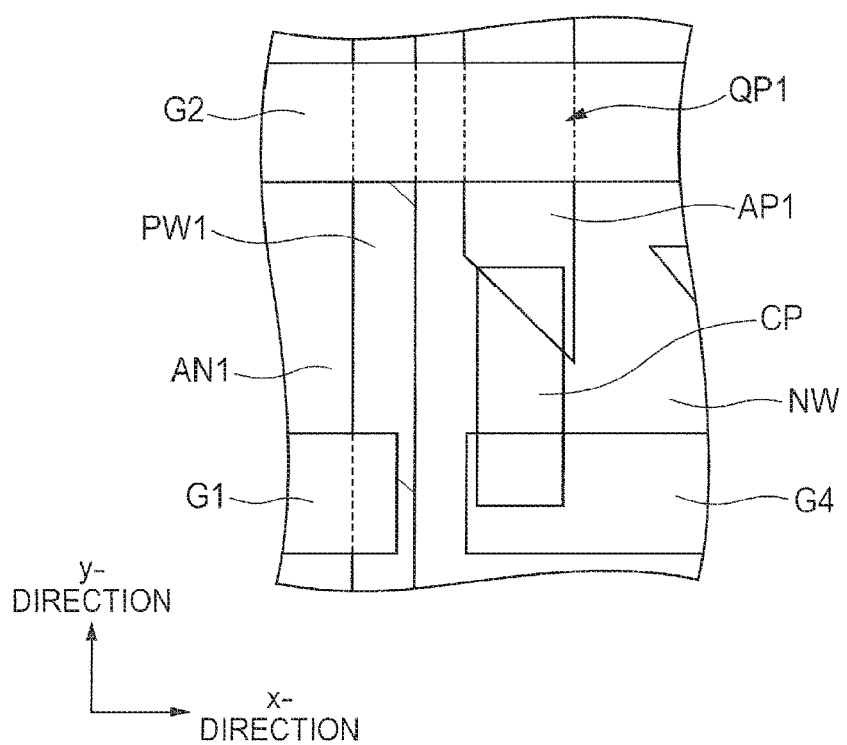
FIG. 11 is a plan view of a semiconductor device according to a comparative example.

In the following description, a problem of a semiconductor device of a comparative example and advantageous effects of the semiconductor device of the present embodiment are described, referring to FIGS. 5 and 8 to 11. FIG. 5 is a plan view of the semiconductor device of the present embodiment. FIGS. 8 and 11 are plan views of an SRAM forming the semiconductor device of the comparative example. FIG. 9 is a cross-sectional view, taken line C-C in FIG. 8. FIG. 10 is a cross-sectional view, taken line D-D in FIG. 8. Although a problem occurring between the active region AP1 and the p-well PW1 illustrated in FIG. 8 is described here, for example, the same problem occurs between the active region AP2 and the p-well PW2.

FIG. 8 illustrates a memory cell MC forming the SRAM that is the semiconductor device of the comparative example. FIG. 8 is a plan view of one memory cell region, as with FIG. 1. The memory cell MC of the comparative example has the same structure as the memory cell MC of the present embodiment (see FIG. 1), except for planar shapes of the active regions AP1 and AP2. Each of the active regions AP1 and AP2 forming the memory cell MC of the comparative example includes only a pattern extending in the y-direction in a plan view.

The boundary between the p-well PW1 and the n-well NW and an entire portion of the active region AP1 extend in parallel, and a distance in the x-direction between this boundary and the active region AP1 is constant at any portion. That is, a distance in the x-direction between this boundary and the end of the active region AP1, a distance in the x-direction between this boundary and the terminated portion of the active region AP1, and a distance in the x-direction between this boundary and the active region AP1 between both ends in the extending direction of the active region AP1 are the same as one another.

The active region AP1 has a rectangular shape in a plan view. Among four sides of the active region AP1, a side on the above-described boundary side and another side on the gate electrode G4 side form an angle of 90 degrees therebetween. Therefore, in the comparative example, a corner of the active region AP1 in the upper surface of the n-well NW is arranged in the vicinity of the p-well PW1.

FIG. 9 illustrates a cross-section including the load MOSFET QP1 and the gate electrode G4. FIG. 9 illustrates the cross-section along the y-direction, taken along a center line of the load MOSFET QP1. The structure illustrated in FIG. 9 is approximately the same as that described referring to FIG. 3. However, when the structure in FIG. 9 is compared with the structure described referring to FIG. 3, a width in the y-direction of contact at which the contact plug CP coupled to the drain region of the load MOSFET QP1 and the gate electrode G4 is in contact with the upper surface of the drain region is larger in the comparative example illustrated in FIG. 9.

Meanwhile, in the semiconductor device of the present embodiment illustrated in FIG. 3, the width in the y-direction of the contact at which the contact plug CP is in contact with the upper surface of the drain region of the load MOSFET QP1 is smaller. This is because, as illustrated in FIG. 1, the end of the active region AP1 is farther from the boundary between the p-well PW1 and the n-well NW than the extending portion of the active region AP1. However, in this embodiment, the center line of the contact plug CP is located on the p-well PW2 side of the centerline of the extending portion of the active region AP1, and the contact plug CP is coupled to the upper surface of the end of the active region AP1 that is formed to be closer to the p-well PW2 than the extending portion. Therefore, the area of contact between the contact plug CP and the drain region is sufficient.

Even if the area of contact between the contact plug CP and the drain region in the present embodiment is smaller as compared with that in the comparative example, there is no problem as long as the contact plug CP and the drain region are electrically coupled to each other via the silicide layer (not illustrated).

FIG. 10 illustrates a cross-section including the end of the active region AP1. FIG. 10 illustrates the cross-section along the x-direction. The structure illustrated in FIG. 10 is approximately the same as that described referring to FIG. 4. However, when the structure in FIG. 10 is compared with the structure described referring to FIG. 4, a distance in the x-direction from the boundary between the p-well PW1 and the n-well NW to the active region AP1 is small in the comparative example illustrated in FIG. 10.

In such a comparative example, there is a problem of a large current (a leak current) flowing between the p-well PW1 and the active region AP1 and between the p-well PW2 and the active region AP2. In an operation of the SRAM, in some cases, a potential of about 2 V, for example, is applied to the p-well PW1 illustrated in FIG. 10, and a potential of 0 V is applied to each of the diffusion layer D1 formed in the active region AP1 in the upper surface of the n-well NW and the n-well NW. A potential difference between the diffusion layer D1 and the p-well PW1 caused by such a voltage application causes electrons in the diffusion layer D1 to move to the p-well PW1, so that the current (the leak current) flows from the p-well PW1 to the diffusion layer D1. This current flow is illustrated with a small arrow in FIG. 8 and with a thick arrow in FIG. 10.

However, because this current is minute, this current does not affect the operation of the SRAM unless the flow of the current concentrates on a specific portion. In the comparative example, as illustrated with an arrow in the vicinity of the corner of the active region AP1 of the load MOSFET QP1 in FIG. 8, the current flowing from the p-well PW1 concentrates on the diffusion layer D1 (see FIG. 10) at the corner of the active region AP1. This is because the right-angled corner of the active region AP1 in the comparative example is arranged in the vicinity of the p-well PW1. Further, in the structure of the comparative example, an electric field concentrates into the p-well PW1 in the vicinity of the end of the active region AP1. That is, the electric field becomes large within the p-well PW1 adjacent to a pn junction at the boundary between the p-well PW1 and the n-well NW.

When concentration of the current and the electric field occurs as described above, the electrons are accelerated by a high electric field and impact ionization occurs. Therefore, the current flowing from the p-well PW1 to the diffusion layer D1 drastically increases, causing malfunction of the SRAM. This results in reduction of reliability of the semiconductor device.

This problem becomes more remarkable when the semiconductor device is miniaturized more. In a case where the dimensions of the memory cell of the SRAM are large, a distance between a boundary between a p-well and an n-well and an active region in an upper surface of the n-well is large. Therefore, concentration of a current described above hardly occurs. Also, in the case where the dimensions of the memory cell of the SRAM are large, a breakdown voltage (an isolation breakdown voltage) between the wells can be maintained even if an impurity concentration in each of the p-well and the n-well is low.

However, in the SRAM having a miniaturized layout, the breakdown voltage (the isolation breakdown voltage) at a pn junction between the wells cannot be maintained without increasing the impurity concentration in each of the p-well and the n-well. Therefore, when the SRAM is miniaturized, it is necessary to increase the impurity concentration in each well. As the impurity concentration in the well increases, the leak current can easily flow from the p-well to the active region in the upper surface of the n-well, for example. Further, in the miniaturized SRAM, the distance between the boundary between the p-well and the n-well and the active region becomes small. As a result, the current can flow to the active region in the upper surface of the n-well from the p-well more easily. Therefore, in the comparative example illustrated in FIG. 8, the leak current concentrates on the corner of the active region AP1, so that malfunction of the SRAM is caused by impact ionization.

In order to prevent occurrence of the above-described problem, in the present embodiment, the corner of the active region in the vicinity of the boundary between the p-well and the n-well is rounded, thus preventing current concentration to a portion of the active region. More specifically, as illustrated in FIG. 5, among the sides of the active region AP1 of the present embodiment, sides on the above-described boundary side form an angle that is larger than 90 degrees and is smaller than 180 degrees, at a boundary between the extending portion and the end of the active region AP1. Therefore, there is no right-angled corner in a coupling portion between the extending portion and the end of the active region AP1. Due to this, it is less likely that the current flowing from the p-well PW1 concentrates to that coupling portion, as compared with the corner of the active region AP1 of the comparative example (see FIG. 8).

In addition, the distance in the x-direction from the boundary between the p-well PW1 and the n-well NW to the active region AP1 is larger on the gate electrode G4 side than on the gate electrode G2 side. An angle of a corner of a coupling portion between one of the sides of the active region AP1, that is located on the above-described boundary side, and the side (the terminated portion) opposed to the gate electrode G4 is larger than 90 degrees and is smaller than 180 degrees. Further, this corner is farther from the above-described boundary than the extending portion of the active region AP1. Therefore, as compared with the corner of the active region AP1 of the comparative example (see FIG. 8), it is less likely that the current flowing from the p-well PW1 concentrates to the corner of the active region AP1 of the present embodiment, illustrated in FIG. 5.

Further, as illustrated in FIG. 4, the distance in the x-direction between the diffusion layer D1 formed at the end of the active region AP1 and the boundary between the p-well PW1 and the n-well NW is larger than that in the comparative example illustrated in FIG. 10.

In this manner, by arranging the end of the active region AP1 illustrated in FIG. 1 to be away from the p-well PW1, it is possible to prevent concentration of the current flowing between the p-well PW1 and the active region AP1 to the corner of the active region AP1. Also, concentration of the electric field within the p-well PW1 in the vicinity of the end of the active region AP1 can be reduced. Further, it is possible to increase the breakdown voltage between the p-well PW1 and the active region AP1. That is, the pn isolation breakdown voltage between the p-well PW1 and the n-well NW can be improved. As a result, it is possible to prevent a large current from flowing between the p-well PW1 and the active region AP1 because of impact ionization. Therefore, occurrence of malfunction of the SRAM can be prevented. This can improve the reliability of the semiconductor device.

In order to obtain the above-described advantageous effects, it suffices to employ a shape in which the active region AP1 gradually goes away from the above-described boundary as it goes closer from the gate electrode G2 side to the gate electrode G4 in a plan view, as in a semiconductor device of a comparative example illustrated in FIG. 11. In the SRAM of the semiconductor device of this comparative example, one of the sides of the active region AP1, located on the p-well PW2 side, extends straight from one terminated portion in the y-direction of the active region AP1 to the other terminated portion. In this point, the semiconductor device of this comparative example in FIG. 11 is different from the semiconductor device of the present embodiment. That is, the active region AP1 illustrated in FIG. 11 has a shape in which the corner of the active region AP1 illustrated in FIG. 8 is cut off, and the end in the y-direction of the active region AP1 does not project towards the p-well PW2 with respect to the extending portion of the active region AP1. Note that FIG. 11 is a plan view of the semiconductor device of the comparative example.

Further, a center line of a contact plug CP coupled to a drain region of a load MOSFET QP1 and a gate electrode G4 of the comparative example overlaps a center line of the extending portion of the active region AP1. In this point, the semiconductor device in FIG. 11 is different from the semiconductor device of the present embodiment.

In this comparative example, the contact plug CP is coupled to the end of the active region AP1, which is tapered in the y-direction, in order to round the corner of the active region AP1 on the side closer to the boundary between the p-well PW1 and the n-well NW. Therefore, the area of contact between the contact plug CP and the active region AP1 is small. In this case, a position at which the contact plug CP is formed and the active region AP1 may not overlap each other in a plan view, because of positional displacement of a position where a contact hole into which the contact plug CP is embedded is formed in a manufacturing step of the semiconductor device, for example. This displacement of the formation position causes a contact failure, because the drain region of the load MOSFET QP1 and the contact plug CP are not electrically coupled. Therefore, the SRAM does not operate normally, resulting in reduction of the reliability of the semiconductor device.

As a structure for preventing such a contact failure, it can be considered that the formation position of the contact plug CP coupled to the drain region is arranged to extend towards the gate electrode G2. In this case, however, the contact plug CP and the gate electrode G2 may be short-circuited. Also, when the formation position of the contact plug CP is arranged to extend towards the gate electrode G2 and the length of the active region AP1 in the y-direction is increased, occurrence of the short-circuit can be prevented. However, miniaturization of the SRAM is hindered.

Therefore, in the present embodiment, as illustrated in FIG. 1, the layout is applied to the active region AP1, in which the end in the y-direction of the active region AP1 is formed to be away from the boundary line between the p-well PW1 and the n-well NW, and, in accordance with such formation, the end goes closer to the boundary line between the n-well NW and the p-well PW2. That is, the end in the y-direction of the active region AP1 has a shape in a plan view in which the end gradually goes closer to the boundary line between the n-well NW and the p-well PW2 as it goes from the gate electrode G2 side to the gate electrode G4 side.

In other words, the end in the y-direction of the active region AP1 projects towards the p-well PW2 with respect to the extending portion of the active region AP1. Because the active region AP2 has a point-symmetric layout with respect to the active region AP1, the end of the active region AP1, which projects towards the p-well PW2, and the end of the active region AP2, which projects towards the p-well PW1, are arranged side by side in the y-direction. Note that a problematic leak current does not occur between the active regions AP1 and AP2 even when the projecting ends thereof are arranged at close positions to each other. This is because a difference between potentials respectively applied to the active regions AP1 and AP2 is small.

In this manner, it is possible to prevent reduction of the width in the x-direction of the end of the active region AP1. That is, the width in the x-direction of the active region AP1 is constant in any region. Therefore, it is possible to ensure a large area of contact of the contact plug CP with the drain region formed at the end. In other words, even when displacement of the formation position of the contact plug CP occurs in the manufacturing step of the semiconductor device, occurrence of a contact failure between the contact plug CP and the drain region can be prevented. Also, it is possible to prevent increase of a coupling resistance caused by an insufficient area of contact between the contact plug CP and the active region AP1.

In this example, the contact plug CP is coupled to the end of the active region AP1 that is widened towards the p-well PW2. Therefore, the formation position of the contact plug CP is set in such a manner that the center line of the contact plug CP is located to be closer to the p-well PW2 than the center line of the extending portion of the active region AP1.

In the present embodiment, the above advantageous effects can be obtained without arranging the formation position of the contact plug CP coupled to the drain region to extend towards the gate electrode G2. Therefore, it is possible to prevent the drain region and the gate electrode G2 from being short-circuited via the contact plug CP. Further, the above-described advantageous effects can be obtained without increasing the length of the active region AP1 in the y-direction. Therefore, miniaturization of the semiconductor device can be easily achieved.

Second Embodiment

Figure 6:
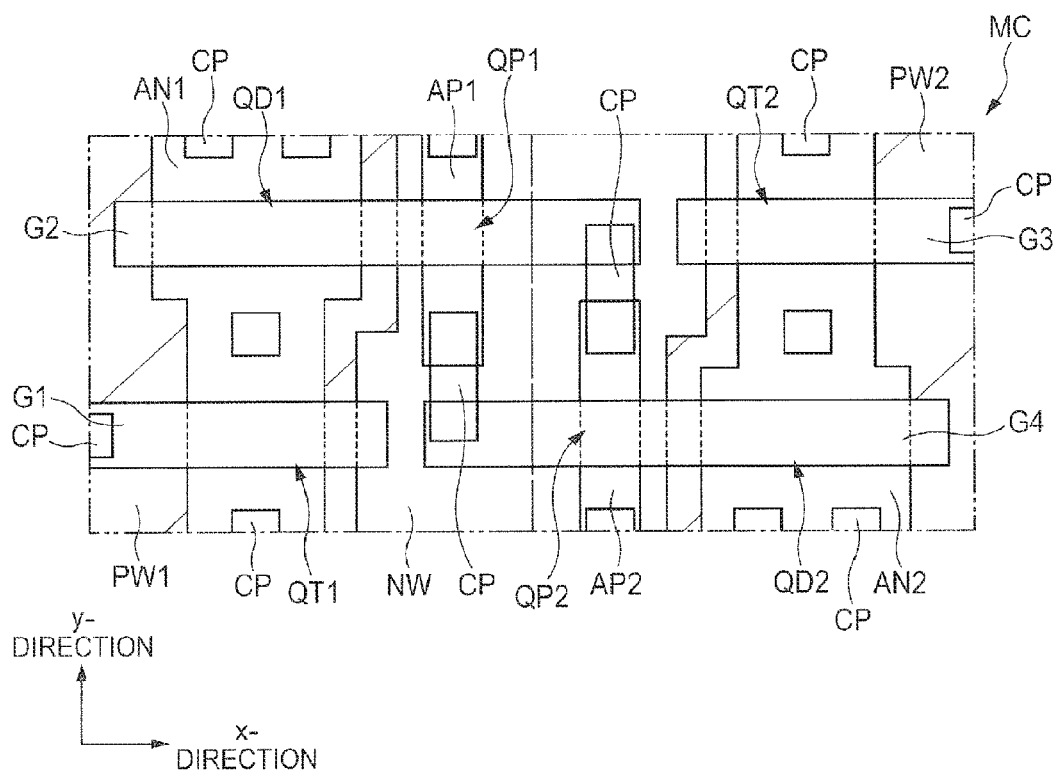
FIG. 6 is a plan view of a semiconductor device according to a second embodiment of the present invention.
Figure 7:
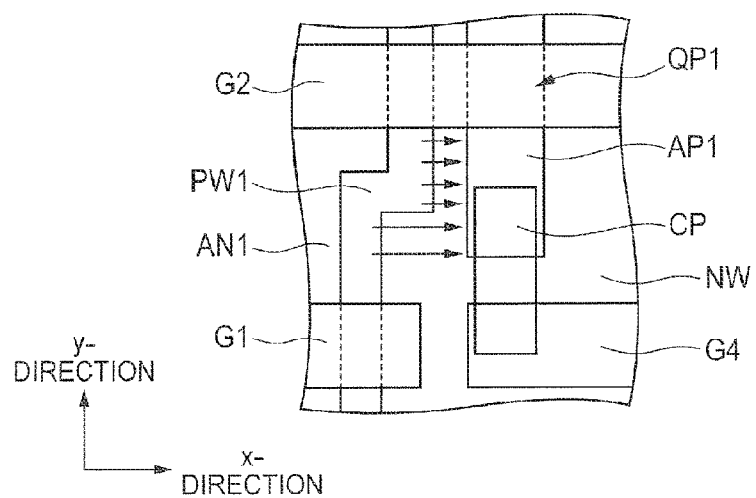
FIG. 7 is an enlarged plan view of a portion in FIG. 2.

The structure of a semiconductor device according to this second embodiment is described, referring to FIGS. 6 and 7. FIGS. 6 and 7 are plan views of the semiconductor device according to the present embodiment. FIG. 7 is a plan view illustrating a portion in FIG. 6 while enlarging the portion.

In an SRAM that is the semiconductor device of the present embodiment, an active region in an upper surface of an n-well is formed straight, and a position of a boundary between a p-well and the n-well is set in such a manner that this boundary is away from an end of the active region. The following description is made mainly to a layout of each the active region AP1, the active region AN2, the boundary line between the p-well PW1 and the n-well NW as illustrated in FIG. 6. Note that the active region AP2, the active region AN2, and the boundary line between the n-well NW and the p-well PW2 respectively have point-symmetric layouts with respect to the layouts of the active region AP1, the active region AN1, and the boundary line between the p-well PW1 and the n-well NW.

The structure illustrated in FIG. 6 is similar to the structure of the SRAM of the first embodiment described referring to FIG. 1, but is different from that of the first embodiment in that each of the active regions AP1 and P2 illustrated in FIG. 6 entirely extends in the y-direction. Also, the present embodiment is different from the first embodiment in the planar layout of each of the boundary between the p-well PW1 and the n-well NW and the boundary between the p-well PW2 and the n-well NW. Further, the present embodiment is different from the first embodiment in the planar layout of each of the active regions AN1 and AN2.

In addition, the center line of the contact plug CP coupled to the drain region of the load MOSFET QP1 overlaps the center line of the active region AP1 in a plan view. Similarly, the center line of the contact plug CP coupled to the drain region of the load MOSFET QP2 overlaps the center line of the active region AP2 in a plan view. The other structure of the SRAM of the present embodiment is the same as the structure of the SRAM of the first embodiment.

As illustrated in FIG. 6, in the present embodiment, the entire portion of each of the active regions AP1 and AP2, including both ends, is formed straight in the y-direction. Each of the active regions AP1 and AP2 has a rectangular planar layout extending in the y-direction. Therefore, in the present embodiment, in order to avoid concentration of a leak current to the end of the active region described referring to FIGS. 8 to 10, the boundary between the p-well PW1 and the n-well NW is largely spaced from the corner of the active region AP1 and the boundary between the n-well NW and the p-well PW2 is largely spaced away from the corner of the active region AP2.

That is, in a case where the active region AP1 has one end in the y-direction, the other end (not illustrated), and an extending portion located between those ends, a distance in the x-direction between those ends and the boundary between the p-well PW1 and the n-well NW is larger than a distance in the x-direction between the extending portion and the boundary between the p-well PW1 and the n-well NW.

In a plan view, the boundary line between the p-well PW1 and the n-well NW has a first boundary line that is arranged side by side with the extending portion of the active region AP1 in the x-direction and that extends in the y-direction, and a second boundary line that is arranged side by side with the end of the active region AP1 in the x-direction and that extends in the y-direction. A distance in the x-direction between the second boundary line and the extending portion of the active region AP1 is larger than a distance in the x-direction between the first boundary line and the extending portion of the active region AP1. The first boundary line and the second boundary line form the boundary line between the p-well PW1 and the n-well NW and are mutually coupled via a third boundary line extending in the x-direction.

In other words, the boundary line between the p-well PW1 and the n-well NW in a plan view is formed by one crank-shaped line obtained by coupling the first boundary line, the third boundary line, and the second boundary line in that order. That is, the shortest distance in the x-direction between the second boundary line and the gate electrode G4 is larger than the shortest distance in the x-direction between the first boundary line and the gate electrode G4. In other words, the shortest distance in the x-direction between the second boundary line and the active region AP1 is larger than the shortest distance in the x-direction between the first boundary line and the active region AP1.

The first boundary line is not arranged side by side with the end of the active region AP1 in the x-direction. In other words, the first boundary line is located on the gate electrode G2 side of the end of the active region AP1, and is terminated on the gate electrode G2 side with respect to the end of the active region AP1. That is, the first boundary line and the third boundary line are located on the extending portion side with respect to the end of the active region AP1. In addition, in a plan view, the first boundary line overlaps the gate electrode G2, whereas the second boundary line does not overlap the gate electrode G2.

The second boundary line is arranged side by side with a portion of the active region AP1 in the x-direction. In other words, the second boundary line is terminated on the gate electrode G2 side of the end of the active region AP1 in the y-direction. An end of the first boundary line, an end of the second boundary line, and the third boundary line coupling those ends are located between the gate electrode G2 and the gate electrodes G1 and G4 within the memory cell region.

A side of the active region AN1, on the n-well NW side, has a crank-shaped planar layout along the boundary line between the p-well PW1 and the n-well NW. In order to minimize the area of the memory cell of the SRAM, it is desirable to arrange the active region AN1 to be as close as possible to that boundary line as long as a large leak current is not caused between the active region AN1 and the n-well NW. In this example, that boundary line is formed by a line obtained by coupling the first boundary line, the third boundary line, and the second boundary line in that order, i.e., a crank-shaped line, as described above. Therefore, the side of the active region AN1, on the n-well NW side, is arranged to have such a layout that that side is away from the boundary line in the x- and y-directions by certain distances.

That is, a distance in the x-direction between the end of the active region AP1 and the side of the active region AN1 on the n-well NW side is larger than a distance in the x-direction between the extending portion of the active region AP1 and the side of the active region AN1 on the n-well NW side. In other words, in a plan view, the side of the active region AN1 on the n-well NW side has a seventh side that is arranged side by side with the extending portion of the active region AP1 in the x-direction and that extends in the y-direction, and an eighth side that is arranged side by side with the end of the active region AP1 in the x-direction and that extends in the y-direction. A distance in the x-direction between the eighth side and the extending portion of the active region AP1 is larger than a distance in the x-direction between the seventh side and the extending portion of the active region AP1. The seventh side and the eighth side are mutually coupled via a ninth side extending in the x-direction.

The seventh side is not arranged side by side with the end of the active region AP1 in the x-direction. The eighth side is arranged side by side with a portion of the active region AP1 in the x-direction. An end of the first boundary line, an end of the second boundary line, and the third boundary line coupling those ends are located between the gate electrode G2 and the gate electrodes G1 and G4 within the memory cell region.

By setting the layout of the side of the active region AN1 on the n-well NW side in the above-described manner, it is possible to prevent a large leak current from flowing between the active region AN1 and the n-well NW and to achieve miniaturization of the semiconductor device at the same time.

In the present embodiment, as illustrated in FIG. 7, the p-well PW1 is spaced away from the end of the active region AP1. This can prevent concentration of a current flowing between the p-well PW1 and the active region AP1 to the corner of the active region AP1, as illustrated with a plurality of arrows in FIG. 7. Also, it is possible to prevent concentration of an electric field within the p-well PW1 in the vicinity of the end of the active region AP1. Therefore, it is possible to prevent a large current from flowing between the p-well PW1 and the active region AP1 because of impact ionization, so that malfunction of the SRAM can be prevented. Consequently, the reliability of the semiconductor device can be improved.

In the above description, the invention made by the inventors of the present application has been specifically described by way of the embodiments. However, it is naturally understood that the present invention is not limited to the aforementioned embodiments, and can be changed in various ways within the scope not departing from the gist thereof.

For example, both the layout of the boundary line between the p-well PW1 and the n-well NW described in the second embodiment (see FIG. 6) and the layouts of the active region AP1 and the contact plug CP coupled to the end of the active region AP1 described in the first embodiment (see FIG. 1) may be applied.

What is claimed is:

1. A semiconductor device comprising a memory cell having an SRAM structure formed on a semiconductor substrate, the memory cell including:
   a first p-type well, an n-type well, and a second p-type well formed in an upper surface of the semiconductor substrate in that order in a first direction along the upper surface of the semiconductor substrate;
   a first n-type field effect transistor and a second n-type field effect transistor formed in a first active region on an upper surface of the first p-type well;
   a first p-type field effect transistor formed in a second active region closest to the first p-type well in the first direction on an upper surface of the n-type well;
   a second p-type field effect transistor formed in a third active region closest to the second p-type well in the first direction on the upper surface of the n-type well; and
   a third n-type field effect transistor and a fourth n-type field effect transistor formed in a fourth active region on an upper surface of the second p-type well,
   wherein the second active region includes an extending portion extending in a second direction along a direction perpendicular to the first direction in a plan view and an end in the second direction of the second active region, and
   wherein a distance between a portion of a boundary between the first p-type well and the n-type well and the end portion that are adjacent to each other in the first direction is larger than a distance between a portion of the boundary and the extending portion that are adjacent to each other in the first direction.

2. The semiconductor device according to claim 1,
   wherein the first p-type field effect transistor includes a first gate electrode formed directly above the extending portion of the second active region,
   wherein the second p-type field effect transistor includes a second gate electrode formed directly above the third active region,
   wherein in the second direction, the end portion of the second active region is located between the first gate electrode and the second gate electrode, and
   wherein the distance in the first direction between the end portion and the boundary gradually increases as the end portion goes from a first gate electrode side to a second gate electrode side.

3. The semiconductor device according to claim 1,
   wherein the distance in the first direction between the end portion and the boundary gradually increases as the end goes from the extending portion towards a terminated portion in the second direction of the second active region.

4. The semiconductor device according to claim 1, wherein an angle formed by a side of the extending portion on the first p-type well side and a side of the end portion on the first p-type well side is larger than 90 degrees and is smaller than 180 degrees.

5. The semiconductor device according to claim 2, wherein an angle formed by a side of the end portion on the first p-type well side and a side of the end portion on the second gate electrode side is larger than 90 degrees and is smaller than 180 degrees.

6. The semiconductor device according to claim 2, wherein the memory cell further includes a coupling portion electrically coupling the second gate electrode and the end portion, and wherein a distance in the first direction between the end portion and the second p-type well gradually decreases as the end portion goes from the first gate electrode side to the second gate electrode side.

7. The semiconductor device according to claim 6, wherein the coupling portion extends in the second direction, and wherein a center line, extending in the second direction through a center in the first direction of the coupling portion, is located on the second p-type well side of a first center line, extending in the second direction through a center in the first direction of the extending portion.

8. The semiconductor device according to claim 1, wherein the end portion projects toward the second p-type well than the extending portion.

9. The semiconductor device according to claim 1, wherein the first p-type field effect transistor and the second p-type field effect transistor form load field effect transistors, wherein the first n-type field effect transistor and the third n-type field effect transistor form transfer field effect transistors, and wherein the second n-type field effect transistor and the fourth n-type field effect transistor form driving field effect transistors.

10. The semiconductor device according to claim 1, wherein the boundary includes, in a plan view, a first boundary line extending in the second direction, a second boundary line extending in the second direction, and a third boundary line coupling the first boundary line and the second boundary line to each other, and wherein a distance between the second boundary line and the extending portion that are adjacent to each other in the first direction is larger than a distance between the first boundary line and the end portion that are adjacent to each other in the first direction.

11. The semiconductor device according to claim 2, wherein the boundary includes, in a plan view, a first boundary line extending in the second direction, a second boundary line extending in the second direction, and a third boundary line coupling the first boundary line and the second boundary line to each other, wherein the first boundary line adjacent to the extending portion in the first direction is located on the first gate electrode side of the end portion, wherein the end portion and the second boundary line are arranged side by side in the first direction, and wherein a distance in the first direction between the second boundary line and the second gate electrode is larger than a distance in the first direction between the first boundary line and the second gate line.

12. The semiconductor device according to claim 10, wherein a shape of the second active region is rectangular in a plan view.

13. The semiconductor device according to claim 10, wherein the first boundary line and the third boundary line are located on the extending portion side of the end portion in the second direction.

14. The semiconductor device according to claim 1, wherein the third active region includes a second extending portion extending in the second direction and a second end portion in the second direction of the third active region, and wherein a distance between a portion of a second boundary between the n-type well the second p-type well and the second end portion that are adjacent to each other in the first direction is larger than a distance between a portion of the second boundary and the second extending portion that are adjacent to each other in the first direction.

15. The Semiconductor device according to claim 14, wherein the third active region has a point-symmetric layout with respect to the second active region within the memory cell.

* * * * *